United States Patent
Griswold

(10) Patent No.: US 9,097,781 B2
(45) Date of Patent: Aug. 4, 2015

(54) NUCLEAR MAGNETIC RESONANCE (NMR) FINGERPRINTING WITH PARALLEL TRANSMISSION

(76) Inventor: Mark Griswold, Shaker Hts., OH (US)

( * ) Notice: Subject to any disclaimer, the term of this patent is extended or adjusted under 35 U.S.C. 154(b) by 581 days.

(21) Appl. No.: 13/445,122

(22) Filed: Apr. 12, 2012

(65) Prior Publication Data

US 2013/0271132 A1  Oct. 17, 2013

(51) Int. Cl.
*G01R 33/50* (2006.01)
*G01R 33/56* (2006.01)
*G01R 33/561* (2006.01)
*G01R 33/54* (2006.01)
*G01R 33/48* (2006.01)
*G01R 33/563* (2006.01)

(52) U.S. Cl.
CPC ........ *G01R 33/5612* (2013.01); *G01R 33/4828* (2013.01); *G01R 33/50* (2013.01); *G01R 33/543* (2013.01); *G01R 33/546* (2013.01); *G01R 33/56* (2013.01); *G01R 33/56341* (2013.01)

(58) Field of Classification Search
USPC .......................... 324/300–322; 600/407–435; 382/128–131; 365/151
See application file for complete search history.

(56) References Cited

U.S. PATENT DOCUMENTS

| | | | |
|---|---|---|---|
| 3,119,099 A * | 1/1964 | Biernat .......................... | 365/151 |
| 3,566,354 A * | 2/1971 | French ........................... | 382/124 |
| 8,723,518 B2 * | 5/2014 | Seiberlich et al. ............ | 324/307 |
| 2007/0086635 A1 * | 4/2007 | Fink et al. ...................... | 382/129 |
| 2012/0235678 A1 * | 9/2012 | Seiberlich et al. ............ | 324/307 |
| 2013/0265047 A1 * | 10/2013 | Griswold et al. ............. | 324/309 |
| 2013/0271132 A1 * | 10/2013 | Griswold ....................... | 324/309 |
| 2014/0103924 A1 * | 4/2014 | Griswold ....................... | 324/309 |
| 2014/0167754 A1 * | 6/2014 | Jerecic et al. ................. | 324/309 |
| 2014/0232399 A1 * | 8/2014 | Griswold et al. ............. | 324/309 |
| 2014/0266199 A1 * | 9/2014 | Griswold et al. ............. | 324/309 |

FOREIGN PATENT DOCUMENTS

WO     WO 2014062346 A1 *  4/2014

* cited by examiner

*Primary Examiner* — Melissa Koval
*Assistant Examiner* — Tiffany Fetzner

(57) ABSTRACT

Apparatus, methods, and other embodiments associated with NMR fingerprinting with parallel transmission are described. One example apparatus includes individually controllable radio frequency (RF) transmission (TX) coils configured to apply varying NMR fingerprinting RF excitations to a sample. The NMR apparatus may apply excitations in parallel. An individual excitation causes different resonant species to produce different signal evolutions. The apparatus includes a parallel transmission logic that causes one of the coils to apply a first excitation to the sample and that causes a different coil to apply a second, different excitation to the sample. The excitations are configured to produce a spatial inhomogeneity between a first region in the sample and a second region in the sample that allows a resonant species to produce a first signal evolution in the first region and to produce a second signal evolution in the second region to facilitate de-correlating the signal evolutions.

20 Claims, 14 Drawing Sheets

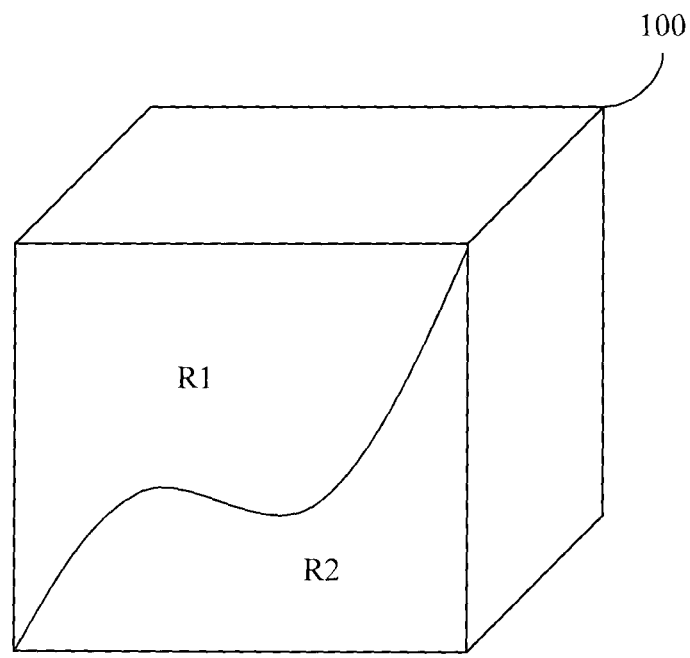
Prior Art Figure 1

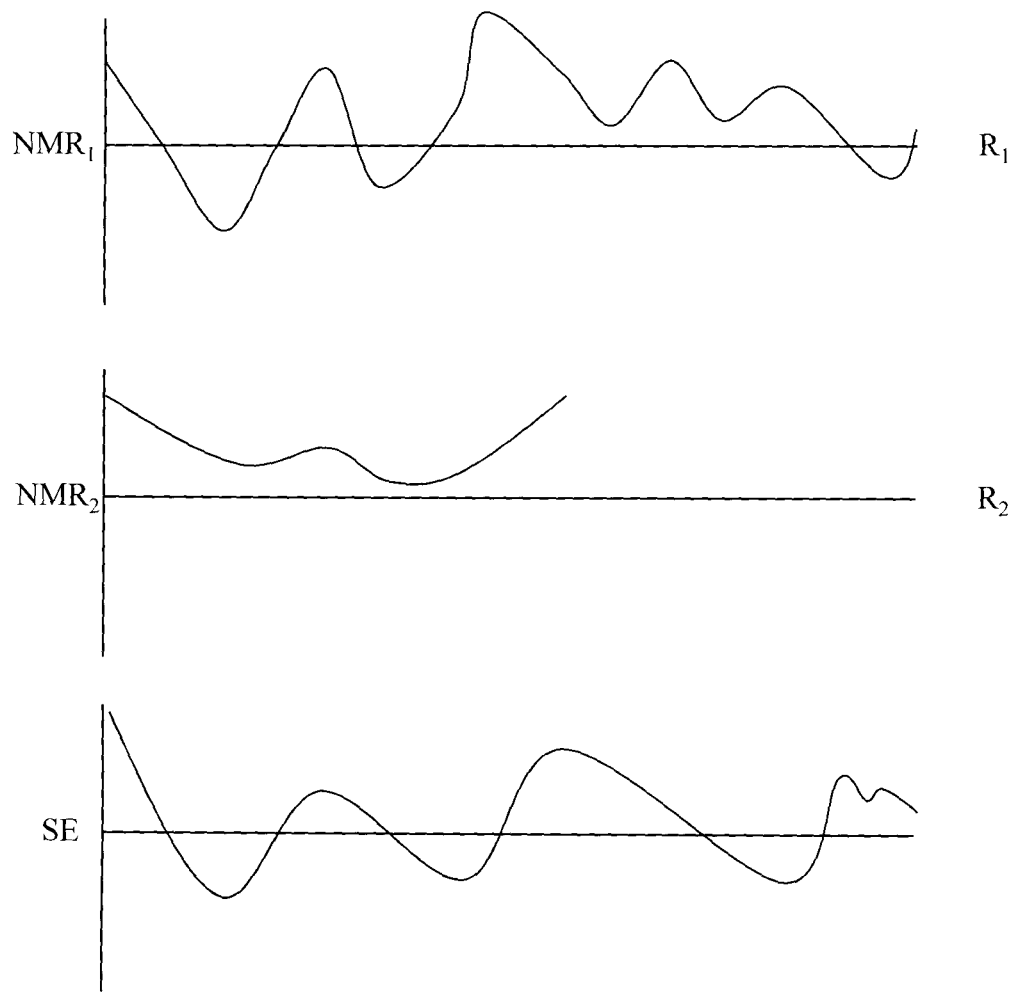
Prior Art Figure 2

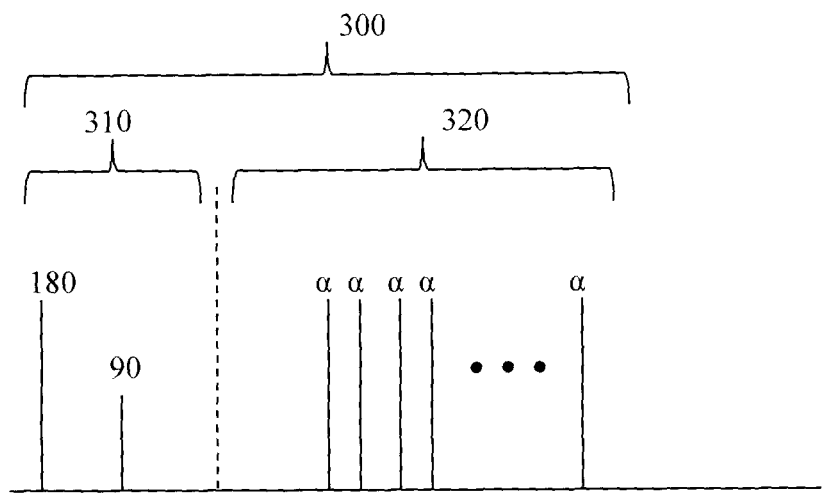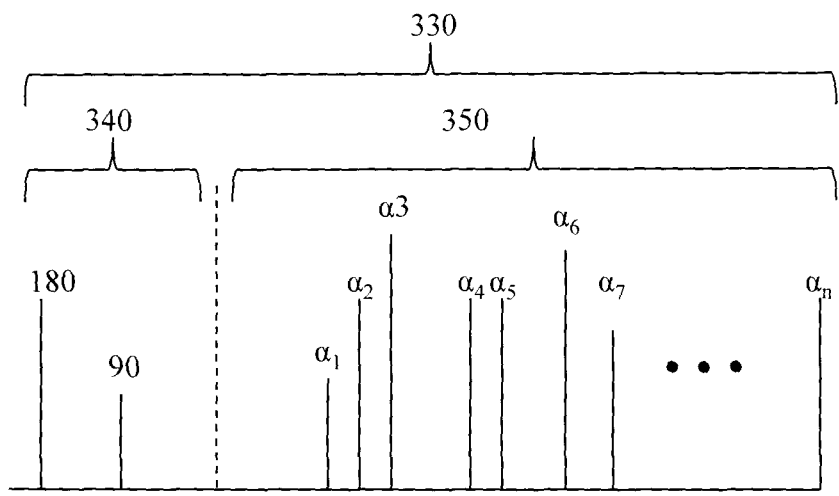
Prior Art Figure 3

Prior Art Figure 9

NUCLEAR MAGNETIC RESONANCE (NMR) FINGERPRINTING WITH PARALLEL TRANSMISSION

BACKGROUND

Nuclear magnetic resonance (NMR) fingerprinting took a different approach to magnetic resonance (MR) than conventional magnetic resonance imaging (MRI). NMR fingerprinting excited multiple resonant species at the same time based on the premise that different types of tissues would have different signal evolutions that could be generated and collected simultaneously. The term "resonant species", as used herein, refers to an item (e.g., water, fat, tissue) that can be made to resonate using NMR. NMR fingerprinting did not define what the signal evolutions for resonant species had to be, rather preferring to capture the generated signals and match them to other known or modeled signals. Since different tissues have different signal evolutions, relaxation parameters were able to be determined by pattern matching the signal evolutions acquired over time to the known and/or simulated signal evolutions.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

FIG. 1 illustrates a volume that contains two resonant species.

FIG. 2 illustrates two individual NMR signals received from two resonant species and a signal evolution derived from the two individual NMR signals.

FIG. 3 compares and contrasts conventional MRI sequence blocks to NMR fingerprinting sequence blocks.

DETAILED DESCRIPTION

Figure 4:
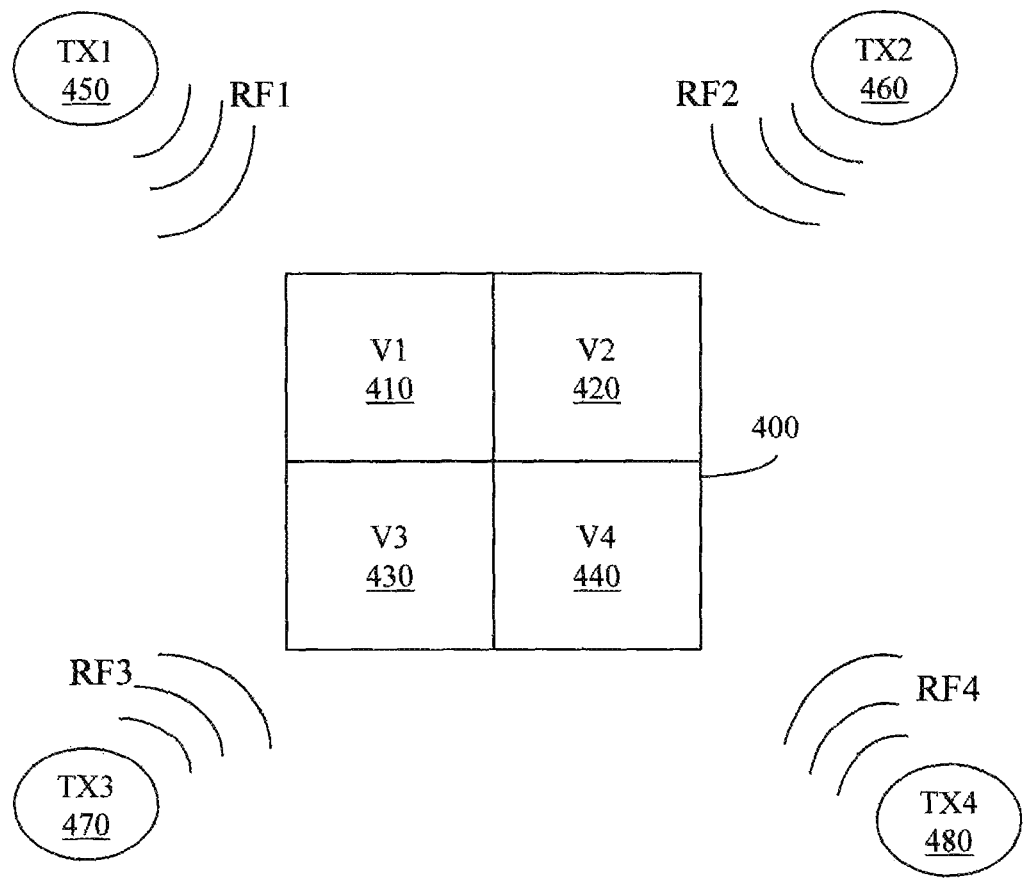
FIG. 4 illustrates a volume being exposed to different RF excitations from different members of a parallel transmission (pTx) array.

Example apparatus and methods improve NMR fingerprinting performance by creating conditions that make it more likely that signal from a first signal producing region (e.g., pixel, voxel) will not be correlated to signal from a second signal producing region (e.g., pixel, voxel) and thus will be treatable as noise with respect to signal from the second signal producing region. Recall that in NMR fingerprinting it is desirable that different tissues have different time courses. Ideally, every tissue would have a different time course. Also ideally, time courses would be orthogonal or not correlated to other time courses. These ideal features would improve NMR fingerprinting pattern matching. However, conventional NMR fingerprinting may have created conditions where signal aliased from a first signal producing region to a second signal producing region was correlated with signal from the second signal generating region. The aliasing correlation may have been exacerbated with higher degrees of under-sampling that were employed to reduce data acquisition time.

Example apparatus and methods facilitate de-correlating signals from separate signal producing regions (e.g., pixel, voxel) by applying different RF excitations from different transmit coils in a parallel transmission (pTx) array of coils. Transmitting different RF excitations from members of the parallel array of TX coils produces conditions where, in effect, multiple different local NMR fingerprinting acquisitions can be performed in parallel. In one embodiment, an in-homogenous flip angle distribution is employed to create the locally varying conditions. Varying other parameters may also produce the locally varying conditions. Creating the locally varying conditions facilitates making time courses from different signal producing regions more orthogonal and less correlated than conventional NMR fingerprinting approaches. Having more orthogonal and less correlated time courses makes signal aliased from one signal producing region less correlated with signal from another signal producing region. Uncorrelated signal may appear as noise.

Example apparatus and methods improve NMR fingerprinting by using additional degrees of freedom available in a parallel transmission (pTx) array of coils to produce conditions that facilitate de-correlating signals from different signal generating regions. In one embodiment, different coils in the pTx array are controlled to apply different RF excitations. The different RF excitations may vary in, for example, amplitude, phase, frequency, flip angle, repetition time (TR), or in other ways. The different RF excitations may produce, for example, an inhomogeneous flip angle distribution that leads to more orthogonal signal evolutions. The more orthogonal signal evolutions may be produced due to, for example, the non-linear MR signal response to the varying RF excitations.

Revisiting the basics of NMR fingerprinting may facilitate better understanding the aliasing/de-correlating issue in NMR fingerprinting and the improvements described herein. FIG. 1 illustrates a volume 100 (e.g., voxel) that contains two resonant species R1 and R2. R1 and R2 may have different relaxation parameters. For example, the $T1_{R1}$ may be less than $T1_{R2}$ while $T2_{R1}$ may be greater than $T2_{R2}$. T1 refers to longitudinal (spin-lattice) relaxation time and T2 refers to transverse (spin-spin) relaxation time. NMR fingerprinting applies RF energy in a series of varied sequence blocks that cause volume 100 to simultaneously produce different NMR signals from both R1 and R2. A signal evolution can be produced from these simultaneously produced different NMR signals. Relaxation parameters (e.g., T1, T2, PD) (PD=proton density) can be determined from the signal evolution through pattern matching to other signal evolutions for which relaxation parameters are known. The resonant species R1 and R2 can then be characterized by the relaxation parameters. Since different tissues have different known relaxation parameters, different tissues can be identified using the relaxation parameter characterization. While two resonant species are illustrated, one skilled in the art will appreciate that a volume may include a greater or lesser number of resonant species. Consider, however, that a volume to be imaged would likely contain many volumes located close together. Disambiguating the signal evolutions from one volume to another volume is enhanced when the signal evolutions in the different volumes are more orthogonal and less correlated. Thus, example apparatus and methods control transmission coils in a pTx array to create conditions where the signal evolutions from different volumes are more likely to be more orthogonal to each other, even if the different volumes contain similar resonant species.

FIG. 2 illustrates plots of two individual NMR signals NMR, and NMR$_2$ received from the two resonant species R1 and R2 in volume 100. NMR, includes data points generated by R1 under different conditions at different times. NMR$_2$ includes data points generated by R2 under the different conditions at the different times. The signal evolution (SE) results from NMR, and NMR$_2$ being generated and acquired simultaneously. The space from which the data points for NMR, and NMR$_2$ is acquired may be referred to as a (k, t, E) space, where in different examples, E refers to (T1, T2, D), (T1, T2, D, . . . ), (T1, T2, . . . ) where D refers to diffusion relaxation. In one example, both t and E may be non-linear. In another example, both t and E may be pseudo-random. Once again, while two plots associated with two resonant species are illustrated, one skilled in the art will appreciate that a volume may include a greater or lesser number of resonant species and thus may produce a greater or lesser number of signals. As described above, a first volume 100 may produce a first SE100 while a second neighboring volume 100' may produce a second SE100'. If the conditions in the two volumes 100 and 100' are substantially similar, and if the resonant species in the two volumes 100 and 100' are substantially similar, then SE100 and SE100' may be similar and may be difficult to disambiguate causing signal from SE100' to "pollute" signal SE100 rather than simply being noise that could be ignored. Example apparatus and methods produce more locally varying conditions (e.g., inhomogeneous flip angle distribution) so that signal SE100' from volume 100' will more likely be able to be treated as noise in signal SE100.

FIG. 3 compares and contrasts conventional sequence blocks to example NMR fingerprinting sequence blocks. Sequence block 300 includes a preparation phase 310 and an acquisition phase 320. During acquisition phase 320, multiple acquisitions using the same flip angle and the same interval between acquisitions may be performed. Acquisition phase 320 resembles approaches that acquire data from a (k, t) space, where t varies either constantly or linearly. The constant variation facilitates acquiring signal with constant amplitude and phase as required for conventional image reconstruction.

Sequence block 330 also includes a phase 340 and an acquisition phase 350. Notice that acquisition phase 350 is longer than acquisition phase 320. Unlike acquisition phase 320 where parameters are either fixed or vary linearly, in acquisition phase 350 the parameters may vary widely, either non-linearly, randomly, and/or pseudo-randomly. Parameters that may vary include, but are not limited to, echo time, flip angle, phase encoding, repetition time, and others. Note also that while phase 340 may, in some examples, be a preparation phase or preparation-like phase, that phase 340 does not necessarily perform a conventional image-centric preparation. In conventional NMR fingerprinting, a single sequence block 330 may have been produced from all the transmit coils available in a pTx array. Embodiments described herein improve on conventional NMR by exercising the additional freedom available to the individually controllable transmit coils by producing different RF excitations in the different transmit coils. For example, different flip angles may be used in the different transmit coils.

FIG. 4 illustrates a volume 400 that is partitioned into four voxels, V1 410, V2 420, V3 430, and V4 440. Example apparatus and methods may present volume 400 with four different types of RF excitations RF1, RF2, RF3, and RF4 produced by transmit coils TX1 450, TX2 460, TX3 470, and TX4 480 respectively. In one example, the RF excitations may differ in attributes including, but not limited to, amplitude, frequency, phase, repetition time (TR), and flip angle. While four voxels, four transmission coils, and four RF excitations are illustrated, different numbers of transmission coils may be employed and may be controlled to produce different numbers and types of RF excitations.

Figure 5:
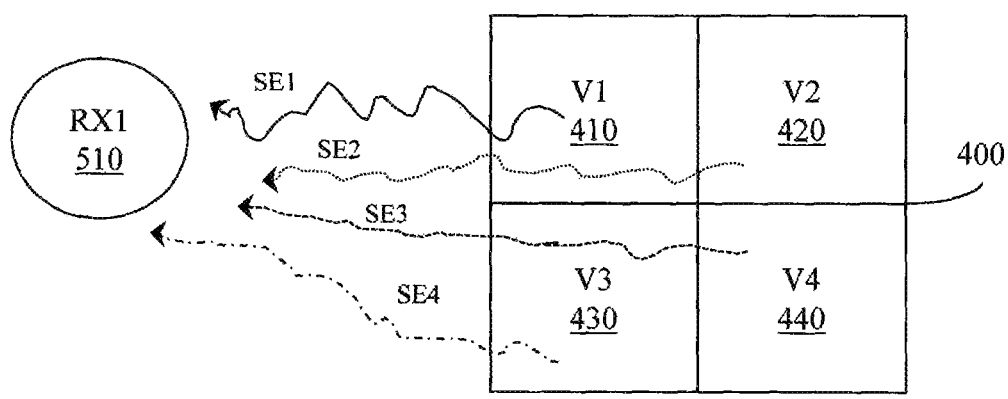
FIG. 5 illustrates a volume producing different signal evolutions.

FIG. 5 illustrates a result of exposing volume 400 to the different excitations. If all of the voxels were exposed to RF excitation, then all of the voxels may produce a signal evolution. Conventionally, all the voxels may have been exposed to homogenous RF excitations. In that conventional case, all the voxels may have produced a substantially similar signal evolution that would be received by receive coil 510. But when the voxels are excited in different ways due to the different RF excitations produced by the different TX coils, then the different voxels may produce different signal evolutions that could be received by receive coil 510. For example, all of SE1, SE2, SE3, and SE4 may be different from each other. While a single receive coil 510 is illustrated, in different embodiments, signal evolutions could be received at multiple receive coils.

Figure 6:
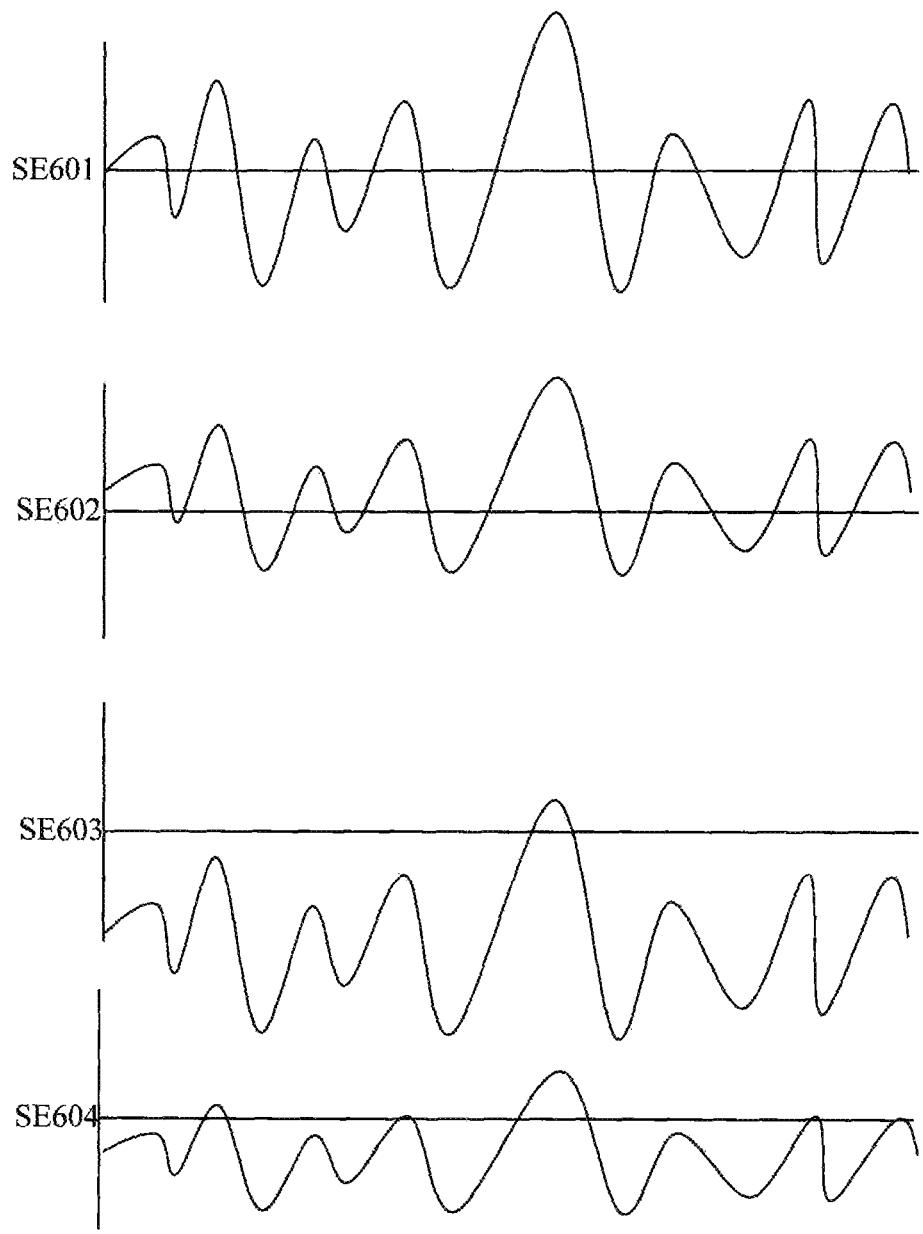
FIG. 6 illustrates four similar signal evolutions.

FIG. 6 illustrates four signal evolutions SE601, SE602, SE603, and SE604 that might be produced by conventional NMR fingerprinting. If the four voxels that produced the four signal evolutions had similar contents and were exposed to similar excitation, then the four signals may have been similar. If the signals are similar, then it may have been difficult to separate signal from a first voxel (e.g., SE601) from signal from a second voxel (e.g., SE602). Instead of just appearing as noise in the voxel producing SE601, SE602 may have altered the signal received from the voxel producing SE601.

Figure 7:
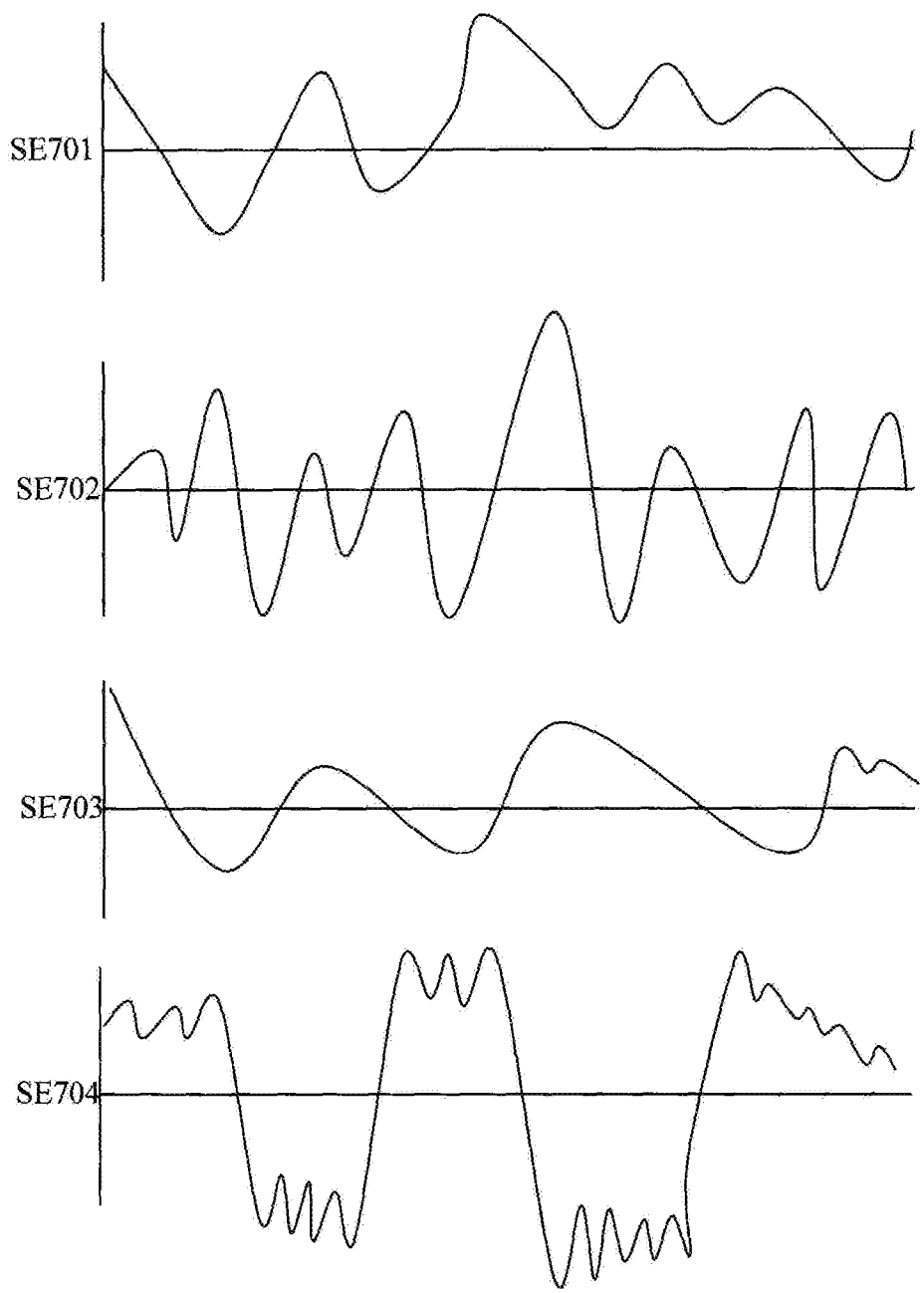
FIG. 7 illustrates four dis-similar signal evolutions.

FIG. 7 illustrates four signal evolutions SE701, SE702, SE703, and SE704 that might be produced by improved NMR fingerprinting as described herein. Even if the four voxels had similar contents, the four signals may be different due to locally varying conditions produced, for example, by an inhomogenous flip angle distribution. In one example, the four signals may differ because the four excitations RF1, RF2, RF3, and RF4 were varied in a manner and amount effective to change contrast from TR to TR and from location to location by creating spatial inhomogeneity in the sample. When the excitations presented by members of a pTx array are controlled to produce the spatial inhomogeneity, then the signals from different voxels may be able to be de-correlated.

Figure 8:
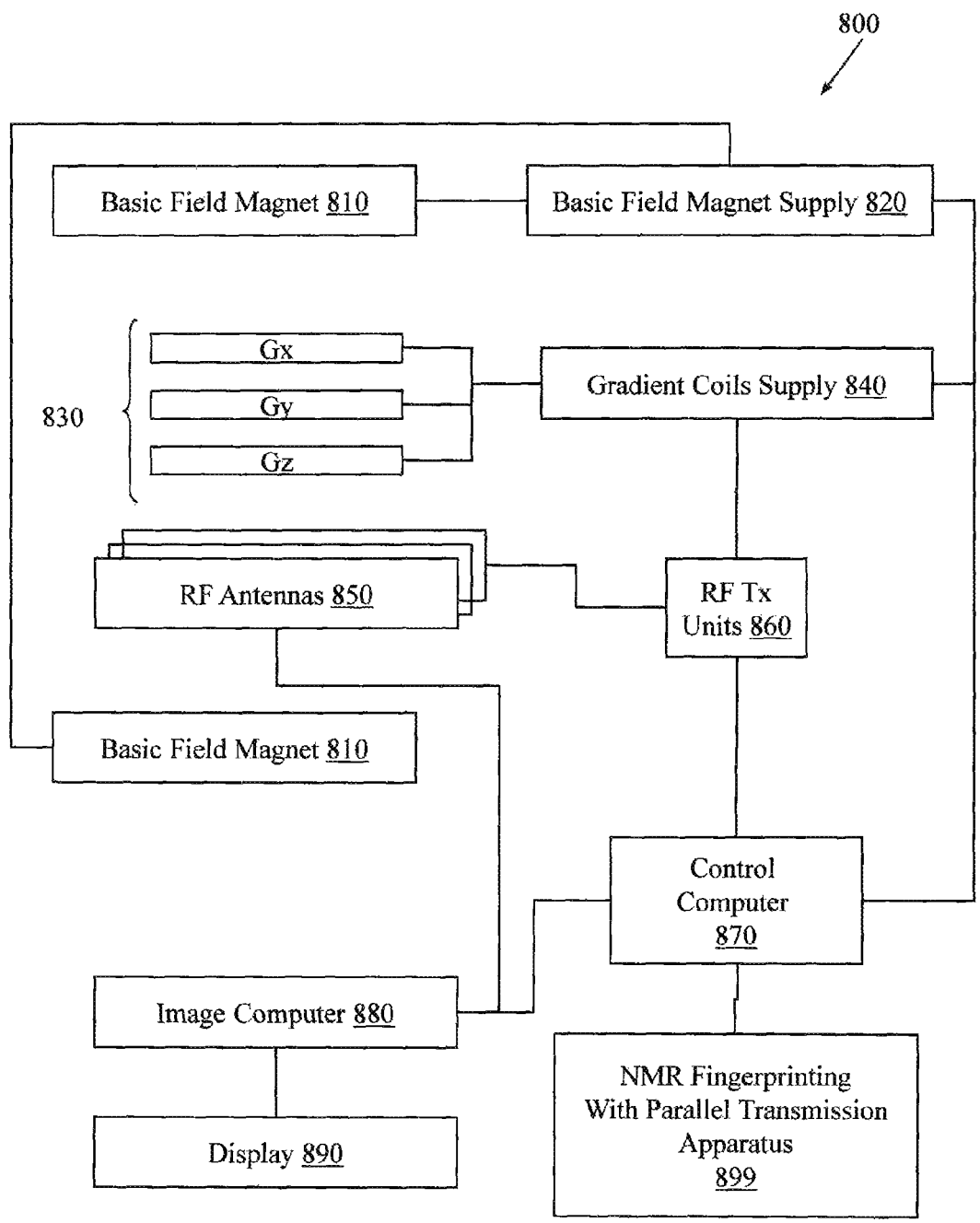
FIG. 8 illustrates an MRI apparatus configured to perform NMR fingerprinting with parallel transmission.

FIG. 8 illustrates an example MRI apparatus 800 configured with an apparatus 899 to control NMR fingerprinting with parallel transmission. The apparatus 899 may be configured with elements of example apparatus described herein and/or may perform example methods described herein.

The apparatus 800 includes a basic field magnet(s) 810 and a basic field magnet supply 820. Ideally, the basic field magnets 810 would produce a uniform $B_0$ field. However, in practice, the $B_0$ field may not be uniform, and may vary over an object being imaged by the MRI apparatus 800. MRI apparatus 800 may include gradient coils 830 configured to emit gradient magnetic fields like $G_S$, $G_P$ and $G_R$ or Gx, Gy, and Gz. The gradient coils 830 may be controlled, at least in part, by a gradient coils supply 840. In some examples, the timing, strength, and orientation of the gradient magnetic fields may be controlled, and thus selectively adapted, during an MRI procedure.

Figure 12:
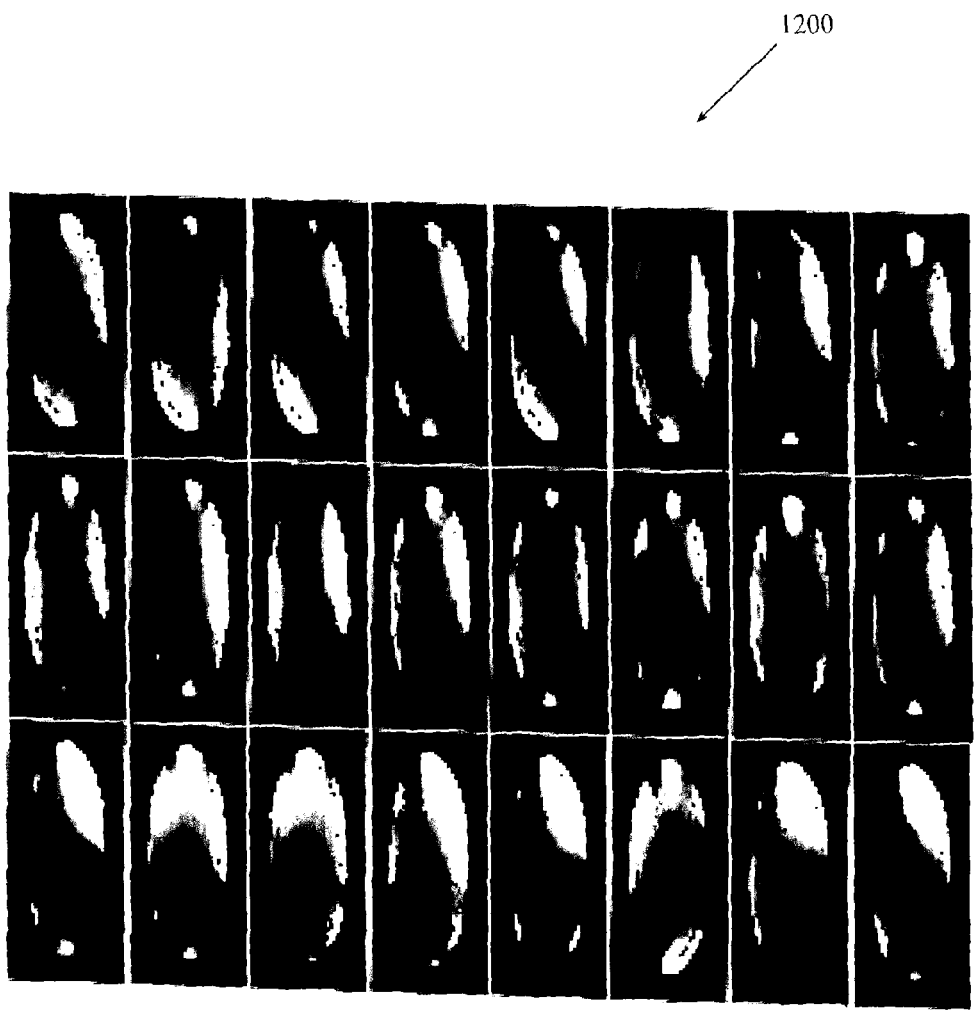
FIG. 12 illustrates flip angle maps produced during NMR fingerprinting with parallel transmission.

MRI apparatus 800 may include a set of RF antennas 850 that are configured to generate RF pulses and to receive resulting NMR signals from an object to which the RF pulses are directed. In one embodiment, the RF antennas 850 are arranged as an array of parallel transmission coils that are individually controllable. How the pulses are generated and how the resulting MR signals are received may be controlled and thus may be selectively adapted during an MR procedure. Separate RF transmission and reception coils can be employed. The RF antennas 850 may be controlled, at least in part, by a set of RF transmission units 860. An RF transmission unit 860 may provide a signal to an RF antenna 850. The RF transmission unit 860 may provide different signals to different RF antennas to produce different RF excitations from the different members of the array of parallel transmission coils. In one example, the different RF excitations may have different flip angles and different TRs. FIG. 12 shows example flip angle maps 1200 that were produced by one embodiment of apparatus 800. The flip angle maps 1200 are associated with twenty four consecutive TRs. The flip angle maps 1200 illustrate that spatial inhomogeneity can be produced throughout a sample to, in effect, facilitate performing localized NMR fingerprinting where the locality is defined by the spatial inhomogeneity. While flip angle maps 1200 are illustrated, in other examples apparatus 800 can be controlled to produce different spatial inhomogeneities.

The gradient coils supply 840 and the RF transmission units 860 may be controlled, at least in part, by a control computer 870. In one example, the control computer 870 may be programmed to control an NMR device as described herein. Conventionally, the magnetic resonance signals received from the RF antennas 850 can be employed to generate an image and thus may be subject to a transformation process like a two dimensional FFT that generates pixilated image data. The transformation can be performed by an image computer 880 or other similar processing device. The image data may then be shown on a display 890. However, fingerprinting apparatus 899 facilitates not having to do conventional reconstruction of an image from MR signals received from the RF antennas 850. Thus the RF energy applied to an object by apparatus 800 need not be constrained to produce signals with substantially constant amplitudes or phases. Instead, fingerprinting apparatus 899 facilitates matching received signals to known signals for which a reconstruction, relaxation parameter, or other information is already available. This facilitates producing a quantitative result.

While FIG. 8 illustrates an example MRI apparatus 800 that includes various components connected in various ways, it is to be appreciated that other MRI apparatus may include other components connected in other ways.

Figure 9:
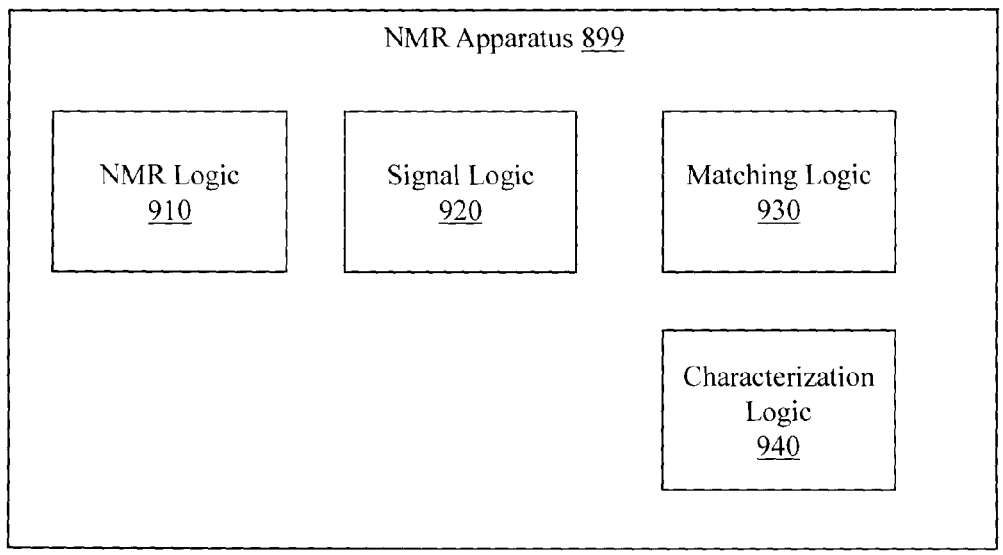
FIG. 9 illustrates an apparatus configured to perform NMR fingerprinting with parallel transmission.
Figure 13:
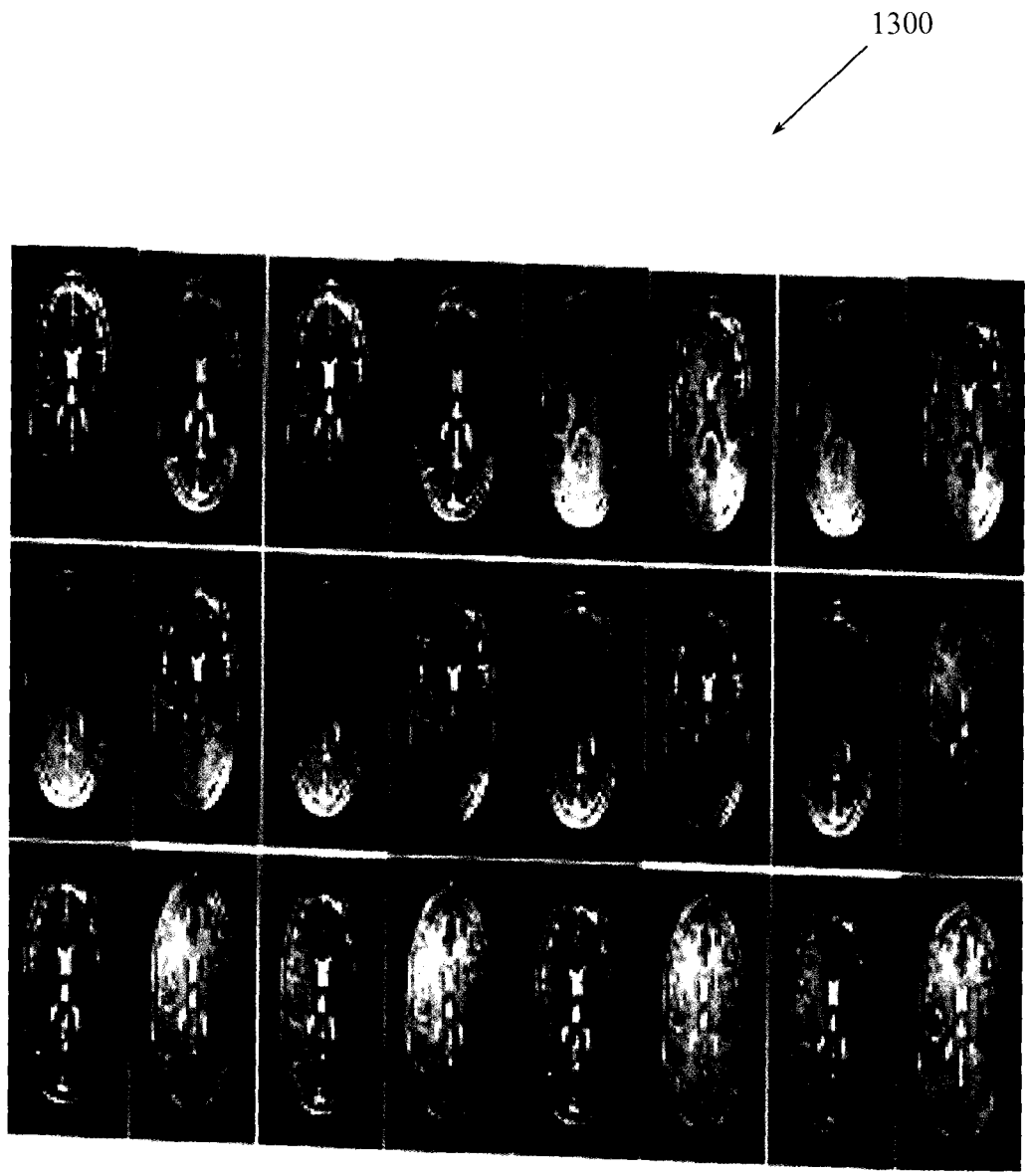
FIG. 13 illustrates maps of effective magnetization produced during NMR fingerprinting with parallel transmission.

FIG. 9 illustrates an embodiment of NMR fingerprinting with parallel transmission apparatus 899. In one embodiment, apparatus 899 includes an NMR logic 910. NMR logic 910 is configured to repetitively and variably sample an object in a (k, t, E) space to acquire a set of NMR signals that may have non-constant amplitude and/or phase. Members of the set of NMR signals are associated with different points in the (k, t, E) space. In different embodiments the different points are sampled according to a plan where t and/or E varies non-linearly and/or in a non-constant manner. NMR logic 910 is configured to acquire NMR signals that were produced in response to different excitations produced in different members of an array of parallel TX coils. FIG. 12 illustrated flip angle maps 1200. Flip angle maps 1200 represent the result of producing different excitations in different members of the array of TX coils. FIG. 13 illustrates effective magnetization images 1300 for different frames. NMR logic 910 is configured to acquire NMR signals that are produced in response to these different effective magnetizations that result from the local inhomogeneities produced by having the different TX coils produce different RF excitations.

NMR apparatus 899 also includes a signal logic 920. Signal logic 920 is configured to produce an NMR signal evolution from the NMR signals. The signal evolution may include a number of NMR signals acquired over a period of time. Unlike conventional systems where NMR signals from different signal producing regions may be similar, signal logic 920 may process NMR signal evolutions that are more orthogonal and thus that may be more de-correlated. Thus, in one example, apparatus 899 may include multiple signal logics 920. Different signal logics may be configured to process signal from different signal producing regions. In one embodiment, the multiple signal logics 920 may be configured to operate in parallel.

NMR apparatus 899 also includes a matching logic 930. Matching logic 930 is configured to compare produced NMR signal evolutions to known NMR signal evolutions. The known NMR signal evolutions may be, for example, previously acquired signal evolutions, or simulated signal evolutions. Like apparatus 899 may include multiple signal logics 920, apparatus 899 may also include multiple matching logics 930. The multiple matching logics 930 may be configured to operate in parallel.

Apparatus 899 may also include a characterization logic 940. Characterization logic 940 is configured to characterize a resonant species in the object by comparing the NMR signal evolution(s) to a characterizing signal evolution(s). Characterizing the resonant species may include identifying relaxation parameters including, but not limited to, T1 relaxation, T2 relaxation, diffusion weighted relaxation, and off-resonance relaxation. The characterizing signal evolution(s) may be stored in a library of characterizing signal evolutions.

Conventional MRI collected a series of images and then fit the pixel time course to a given signal equation that could be non-linear. Conventional MRI acquisition relied on a signal being constant over a short period of time so that complete images that represented discrete points along a given signal evolution could be generated. This approach involved acquiring many segmented acquisitions to cover a signal evolution.

Conventional MRI systems excited regions one voxel or one slice of voxels at a time and then listened to the result of the excitation of the one voxel or one slice of voxels at a time. Some conventional parallel MRI systems excited multiple voxels at the same time and listened to multiple voxels at the same time. These conventional MRI systems used precisely defined trajectories to sample regions in a volume to be imaged.

Conventional MRI pulse sequences included a preparation phase, a waiting phase, and an acquisition phase that were configured to produce signals from which images could be made. The preparation phase determined when a signal could be acquired and determined the properties of the acquired signal. For example, a first pulse sequence may have been designed to produce a T1-weighted signal at a first echo time (TE) while a second pulse sequence may have been designed to produce a T2-weighted signal at a second TE.

Conventional pulse sequences were typically designed to provide qualitative results where images were acquired with various weightings or contrasts that highlighted a particular parameter (e.g., T1 relaxation, T2 relaxation). A conventional MRI acquisition involved numerous repetitions of prepare/wait/acquire pulse sequences. For example, the first pulse sequence may have been applied a large number of times to acquire T1 weighted signals for all voxels in a volume of interest (RoI) and then the second pulse sequence may have been applied a large number of times to acquire T2 weighted signals for all the voxels in the RoI. The voxels may have been acquired in a certain path defined by an acquisition order (e.g., Cartesian, radial).

Seen from a different point of view, conventional MRI used precise preparation times to create precise preparation conditions that facilitated acquiring signals from a series of precisely defined locations on a projection path (e.g., Cartesian, radial) at short precise points in time to make imprecise qualitative images. Conventional MRI attempted to force voxel contents (e.g., water, fat) to emit certain signals at certain times and then reconstructed images from these signals.

NMR fingerprinting took a different approach. NMR fingerprinting chose to sample (k, t, E) space. NMR fingerprinting was not constrained to acquire signal voxel by voxel, slice by slice, or characteristic by characteristic. Instead, NMR fingerprinting facilitated analyzing N characteristics in M voxels at the same time, N and M being numbers. Also unlike conventional MRI, NMR fingerprinting facilitated acquiring useful signal for a longer period of time, rather than during an instantaneous period of time associated with a specified echo time (TE).

NMR fingerprinting was distinguished over the work of Twieg and Doneva based on the intensive reconstruction computations required in Twieg and the imaging based approach in Doneva. See, for example, Twieg, *Parsing local signal evolution directly from a single-shot MRI signal: a new approach for fMRI*, Magn Reson Med 2003, November; 50(5):1043-52, which describes a single-shot MRI method that performs single-shot parameter assessment by retrieval from signal encoding. Twieg recognized that local decay and phase evolution occur and therefore modeled each signal datum as a sample from (k, t) space rather than k-space. While this was an improvement, it did not reach as far as sampling (k, t, E) space. See also, for example, Doneva, et al., *Compressed sensing reconstruction for magnetic resonance parameter mapping*, Magnetic Resonance in Medicine, Volume 64, Issue 4, pages 1114-1120, October 2010. Doneva recognized that different tissues in the human body could be distinguished in MRI by their intrinsic MR parameters including proton density, T1 relaxation time, and T2 relaxation time. However, Doneva used an imaging based approach that relied on a library whose curves were characterized by equations of the form:

$$SE = A + Be^{-t/C} \quad [1]$$

where SE is a signal evolution, A is a constant, B is a constant, t is time, and C is a single relaxation parameter. While this was also an improvement, the single relaxation parameter limited the variety of signal evolutions.

NMR fingerprinting employed a series of varied sequence blocks that produced different signal evolutions in different resonant species (e.g., tissues) to which the RF was applied. When NMR fingerprinting systems applied RF energy to a volume that had both bone and muscle tissue, then both the bone and muscle tissue produced an NMR signal. However the "bone signal" and the "muscle signal" were different. The different signals could be collected over a period of time to identify a signal evolution for the volume. Collecting signals over a period of time produced a signal evolution rather than just a single discrete value for a pixel. Resonant species in the volume were then characterized by comparing the signal evolution to known evolutions. The comparing may have been performed by, for example, pattern matching. Characterizing the resonant species may have included identifying different relaxation parameters (e.g., T1, T2, diffusion resonant frequency).

NMR fingerprinting did not define what the signals produced by the resonant species had to be, only that the signals should be different between different resonant species. The different NMR signals did not have to have constant signal strength or phase, thus much of the preparation involved in conventional MRI pulse sequences was abandoned. Since tissues may produce different signals, the process of determining the relaxation parameters was reduced to pattern recognition in the signal time course. NMR fingerprinting facilitated maximizing contrast between resonant species without ignoring resonant species that may have been in the volume or object. In summary, NMR fingerprinting involved applying a series of varied sequence blocks that generated a particular signal evolution signature (e.g., fingerprint) that was specific for a particular combination of parameters and resonant species in a volume.

Like conventional MRI, NMR fingerprinting manipulated the magnetic field in which an object was located and manipulated the application of RF energy at different frequencies. In one embodiment, NMR fingerprinting employed pseudo-random routines that allowed a volume to produce the signal(s) the volume was going to produce in response to a variety of changing conditions created by a variety of changing applications of RF energy. NMR fingerprinting then compared a signal that evolved from the received signals to known signals that had similarly evolved from other acquisitions at other times under similar conditions or to a set of simulated expected or predicted curves. If the received signal evolution matched or could be fit to within a threshold of a known, simulated, or predicted signal evolution, then the volume that generated the signal evolution likely held the same number, type, and mixture of spins as the volume that produced that matched or fitted signal evolution.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 10:
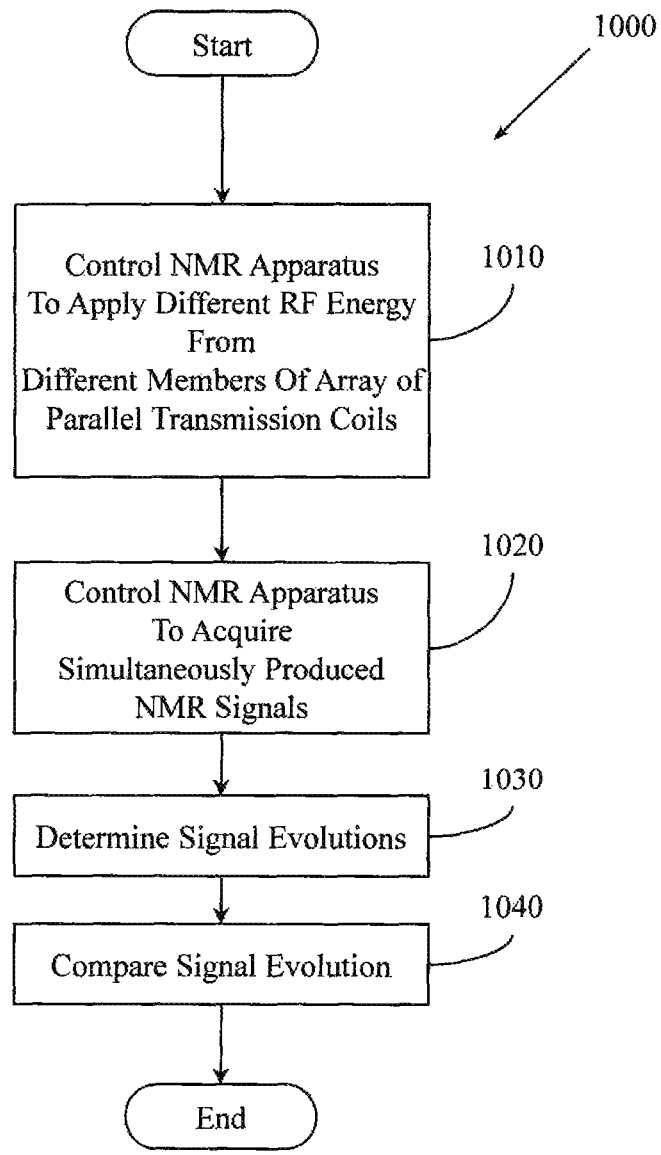
FIG. 10 illustrates an example method configured to perform NMR fingerprinting with parallel transmission.

FIG. 10 illustrates a method 1000 associated with NMR fingerprinting with parallel transmission. Method 1000 includes, at 1010, controlling an NMR apparatus to apply RF energy to a volume in an object. The volume may contain one or more resonant species. In one embodiment, the object may be a human and thus resonant species may include, but are not limited to, tissue, fat, water, hydrogen, and prosthetics. Unlike conventional systems, controlling the NMR apparatus at 1010 may include controlling different members of a parallel transmission (pTx) array to apply different RF energy excitations. The different RF energy excitations may vary in ways including, but not limited to, amplitude, phase, frequency, flip angle, and repetition time (TR). In one embodiment, varying the flip angles in different RF excitations in different members of the set of TX coils can produce flip angle maps like those illustrated in FIG. 12 which in turn may produce magnetization maps like those illustrated in FIG. 13.

Method 1000 concerns controlling an NMR apparatus configured with two or more individually controllable transmit (TX) coils. Method 1000 controls the NMR apparatus to apply a first NMR fingerprinting RF excitation from a first of the two or more TX coils to a sample and to apply a second, different NMR fingerprinting RF excitation from a second of the two or more TX coils to the sample. In one embodiment, the two different NMR RF excitations are applied in at the same time from the different coils in the pTx array. In one example, the first NMR fingerprinting RF excitation and the second NMR fingerprinting RF excitation may be configured to produce a spatial inhomogeneity in a sample to which the first NMR fingerprinting RF excitation and the second NMR fingerprinting RF excitation are applied. The sample may be, for example, a human, an animal, or other object. The sample may include one or more resonant species. In one example, the spatial inhomogeneity is configured to facilitate de-correlating signal evolutions from different signal generating regions in the sample.

Method 1000 may include controlling the NMR apparatus to make the first NMR fingerprinting RF excitation and the second NMR fingerprinting RF excitation, differ in one or more of, amplitude, phase, frequency, repetition time (TR), and flip angle. Method 1000 may include controlling the NMR apparatus to make the first NMR fingerprinting RF excitation and the second NMR fingerprinting RF excitation differ in an amount effective to change contrast in the sample from TR to TR. Method 1000 may include controlling the NMR apparatus to make the first NMR fingerprinting RF excitation and the second NMR fingerprinting RF excitation differ in an amount effective to change contrast in the sample from location to location.

The RF energy applied from a member of the pTx array of coils may be applied in a series of variable sequence blocks. Sequence blocks may vary in a number of parameters including, but not limited to, echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling. In different embodiments two, three, four, or more parameters may vary between sequence blocks. In different embodiments, the number of parameters varied between sequence blocks may itself vary. For example, A1 (sequence block 1) may differ from A2 in five parameters, A2 may differ from A3 in seven parameters, and A3 may differ from A4 in two parameters. In one example, the only difference between consecutive sequence blocks may be the number of $\alpha 2$ pulses.

Controlling the NMR apparatus at 1010 to apply different RF energy excitations through different members of the pTx array may include varying parameters for a single coil over time and also include varying parameters between coils over time. Thus example apparatus and methods may vary parameters in two dimensions: through time for a single coil, and spatially between coils. By way of illustration a first coil TX1 may produce a series of RF excitations TX1RF1, TX1RF2, ... TX1RFn at times T1, T2, ... Tn. A second coil TX2 may also produce a series of excitations TX2RF1, TX2RF2, ... TX2RFn. The signals from TX1 may vary amongst themselves (e.g., TX1RF1≠TX1RF2). Similarly, the signals from TX2 may vary amongst themselves (e.g., TX2RF1≠TX2RF2). Additionally, the signals may vary between coils (e.g., TX1RF1≠TX2RF1).

The RF energy applied during a sequence block is configured to cause different individual resonant species to simultaneously produce individual NMR signals. At least one member of the series of variable sequence blocks will differ from at least one other member of the series of variable sequence blocks in at least N sequence block parameters, N being an integer greater than one. Additionally, at least one RF TX coil will deliver an RF excitation that differs from the RF excitation delivered by a different RF TX coil in the parallel array of transmission coils in at least M parameters. In different embodiments N may be a number greater than one. Similarly, in different embodiments M may be a number greater than one. The signal content of a signal evolution may vary directly with N and M. Thus, as more parameters are varied, a potentially richer signal is retrieved. Additionally, as more pTx coils deliver different RF excitations, signals that potentially may be more able to be de-correlated can be produced.

In one embodiment, the NMR apparatus may be controlled at 1010 to apply members of the series of variable sequence blocks according to a partially random acquisition plan configured to under-sample the object at an under-sampling rate R. In different embodiments, rate R may be, for example, two, four, or even larger numbers.

Method 1000 also includes, at 1020, controlling the NMR apparatus to acquire the simultaneously produced individual NMR signals. The NMR apparatus can be controlled to acquire signal for various lengths of time including, for example, up to ten seconds, up to twenty seconds, up to one hundred seconds, or for even longer. NMR signals can be acquired for longer periods of time because signal information content remains viable for longer periods of time in response to the series of varied RF energy applied at 1010.

Method 1000 also includes, at 1030, controlling the NMR apparatus to determine a signal evolution from the acquired NMR signals. Determining the signal evolution may include storing (k, t, E) space data points acquired during action 1020. While an individual sequence block may yield a single point in (k, t, E) space, the signal evolution is determined by the series of variable sequence blocks. Over time, series of variable sequence blocks that yield useful signal evolutions may be identified. Determining the signal evolution at 1030 for a first signal producing region may include treating a signal from a second signal producing region as noise in a first signal producing region. Treating the signal as noise is facilitated when the two signals are more orthogonal and thus can be de-correlated. The degree of orthogonality may vary directly with the number of parameters varied per sequence block and may also vary directly with the number of different RF excitations produced by different members of the parallel array of transmission coils.

Method 1000 also includes, at 1040, controlling the NMR apparatus to compare the signal evolution to one or more known, stored, simulated, and/or predicted signal evolutions. In different examples, the "stored" or "known" signal evolutions may include previously acquired signals, simulated signals, or both. In one embodiment, the stored signal evolutions are associated with signals not acquired from the object while in another embodiment the stored signal evolutions are associated with signals acquired from the object.

The stored signals may be associated with a potentially very large data space. Thus, one skilled in the art will appreciate that the stored signal evolutions may include signals outside the set of signal evolutions characterized by:

$$SE = A - Be^{-t/C} \quad [1] \text{ described above.}$$

Indeed, one skilled in the art will appreciate that the very large data space for the stored signal evolutions can be partially described by:

$$SE = \prod_{i=1}^{N_A} \sum_{j=1}^{N_{RF}} R_i(\alpha) R_{RF_{ij}}(\alpha, \varphi) R(G) E_i(T1, T2, D) \quad [2]$$

where:
SE is a signal evolution,
$N_A$ is a number of sequence blocks,
$N_{RF}$ is a number of RF pulses in a sequence block,
$\alpha$ is a flip angle,
$\phi$ is a phase angle,
$R_i(\alpha)$ is a rotation due to off resonance,
$R_{RF_{ij}}(\alpha,\phi)$ is a rotation due to RF differences,
$R(G)$ is a rotation due to a gradient,
T1 is spin-lattice relaxation,
T2 is spin-spin relaxation,
D is diffusion relaxation, and
$E_i(T1, T2, D)$ is decay due to relaxation differences.

While $E_i(T1, T2, D)$ is provided as an example, one skilled in the art will appreciate that in different embodiments, $E_i(T1, T2, D)$ may actually be $E_i(T1, T2, D, \ldots)$, or $E_i(T1, T2, \ldots)$.

In one example, the summation on j could be replaced by a product on j, eg.:

$$SE = \prod_{i=1}^{N_A} \sum_{j=1}^{N_{RF}} R_i(\alpha) R_{RF_{ij}}(\alpha, \varphi) R(G) E_i(T1, T2, D). \quad [3]$$

In NMR, MRI, or ESR (electron spin resonance), a Bloch equation is a member of a set of macroscopic equations that are used to calculate the nuclear magnetization $M=(M_x, M_y, M_z)$ as a function of time when relaxation times $T_1$ and $T_2$ are present. These phenomenological equations were introduced by Felix Bloch and may also be referred to as the equations of motion of nuclear magnetization. One skilled in the art will appreciate that in one embodiment $Ri(\alpha)$, $R_{RF_{ij}}(\alpha,\phi)$, and R(G) may be viewed as Bloch equations.

While FIG. 10 illustrates various actions occurring in serial, it is to be appreciated that various actions illustrated in FIG. 10 could occur substantially in parallel. By way of illustration, a first process could control applying RF energy, a second process could control acquiring NMR signals and determining a signal evolution, and a third process could perform signal evolution comparisons. While three processes are described, it is to be appreciated that a greater and/or lesser number of processes could be employed.

Figure 11:
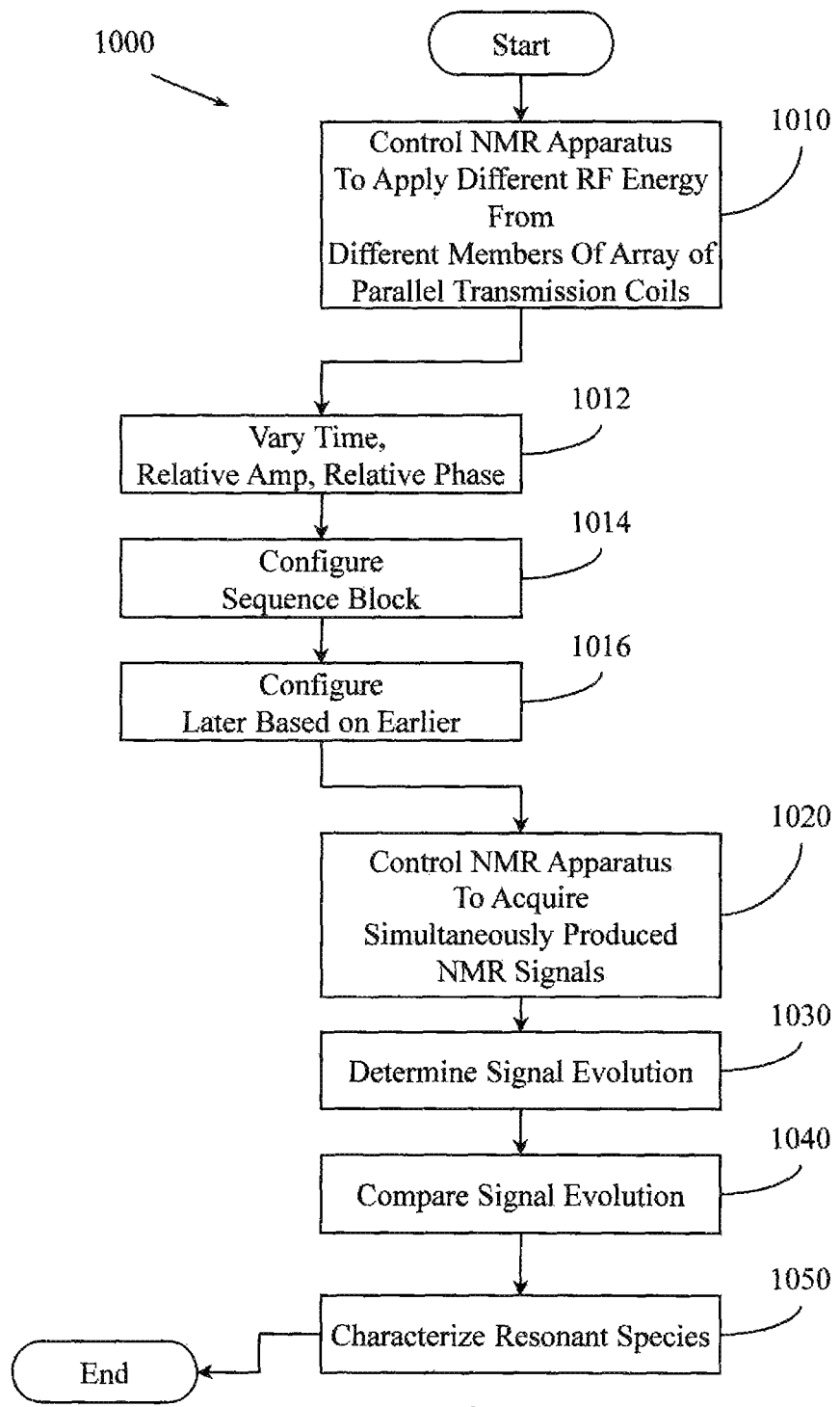
FIG. 11 illustrates an example method configured to perform NMR fingerprinting with parallel transmission.

FIG. 11 illustrates another embodiment of method 1000 (FIG. 10). This embodiment includes actions 1010, 1020, 1030, and 1040. However, this embodiment also includes actions 1012, 1014, 1016, and 1050.

This embodiment of method 1000 includes, at 1012, controlling the NMR apparatus to vary one or more of, the amount of time between sequence blocks, the relative amplitude of sequence blocks, and the relative phase of sequence blocks. The sequence blocks can be varied amongst members of the pTx array that are transmitting in parallel. The sequence blocks can also be varied within a single member of the pTx array. Thus, not only can the individual parameters (e.g., flip angle, phase) be varied between sequence blocks, but the times between sequence blocks and other differences between sequence blocks can be varied both in a single coil and between coils. This facilitates creating additional signal content in the signal evolution.

The varying at 1012 may be coordinated between members of the parallel array of transmission coils. In one example, sequences may cycle around members of the parallel array of transmission coils. For example, a first sequence applied at a first time through a first TX coil may be the second sequence applied at a second time through a second TX coil. Other combinations are possible.

This embodiment of method 1000 also includes, at 1014, controlling the NMR apparatus to configure a member of the series of variable sequence blocks as one of, a TrueFISP pulse sequence, a FLASH pulse sequence, and a turbo spin echo (TSE) pulse sequence. Action 1014 illustrates that a set of sequence blocks is not necessarily the same thing as a conventional imaging-based pulse sequence. A sequence block differs from a conventional pulse sequence for at least the reason that non-linearly varying Δt and ΔE, which produce NMR signals in (k, t, E) space having non-constant amplitudes and phases are encouraged, not prohibited. Additionally, applying different variable sequence blocks from different TX coils is encouraged.

This embodiment of method 1000 also includes, at 1016, controlling the NMR apparatus to configure a later member of the series of variable sequence blocks based, at least in part, on an NMR signal acquired in response to applying an earlier member of the series of variable sequence blocks. Thus, this embodiment of method 1000 is an adaptive method where the order of members of the series of varied sequence blocks may not be known ahead of time. Instead, as data points in (k, t, E) space are acquired, and as a signal evolves, decisions concerning different sequence blocks and different sets of parameters to vary may be made. The decision may control the sequence blocks that are produced by different members of the array of transmission coils. By way of illustration, a first number of data points in (k, t, E) space and an evolving signal may be leading towards one relaxation parameter determination and away from another relaxation parameter determination. Therefore, sets of sequence blocks that can confirm and/or reject either of these leads may be applied next in the set of series to facilitate a guided and more rapid convergence in the pattern matching process.

This embodiment of method 1000 also includes, at 1050, controlling the NMR apparatus to characterize at least one of the resonant species as a function of comparing the signal evolution(s) to one or more stored (e.g., known, simulated, predicted) signal evolutions. Comparing the acquired signal evolution to a stored signal evolution may include, for example, controlling the NMR apparatus to compare the signal evolution to members of a multi-dimensional set of NMR signal evolutions. A first dimension in the multi-dimensional set may be associated with a first set of sequence block parameters and a second dimension in the multi-dimensional set may be associated with a second, different set of sequence block parameters. Since a signal evolution evolves over time, the multi-dimensional set may include a time dimension and the pattern matching process may include a path matching process that monitors the progress of the signal evolution. Additionally, since one series of varied sequence blocks may differ from another series of varied sequence blocks, the multi-dimensional set may include an order dimension where once again the pattern matching process may path match as opposed to just pattern matching.

Characterizing a resonant species may include, for example, identifying relaxation parameters including, but not limited to, T1 relaxation associated with the resonant species, T2 relaxation associated with the resonant species, off-resonance relaxation associated with the resonant species, and diffusion weighted relaxation associated with the resonant species.

Figure 14:
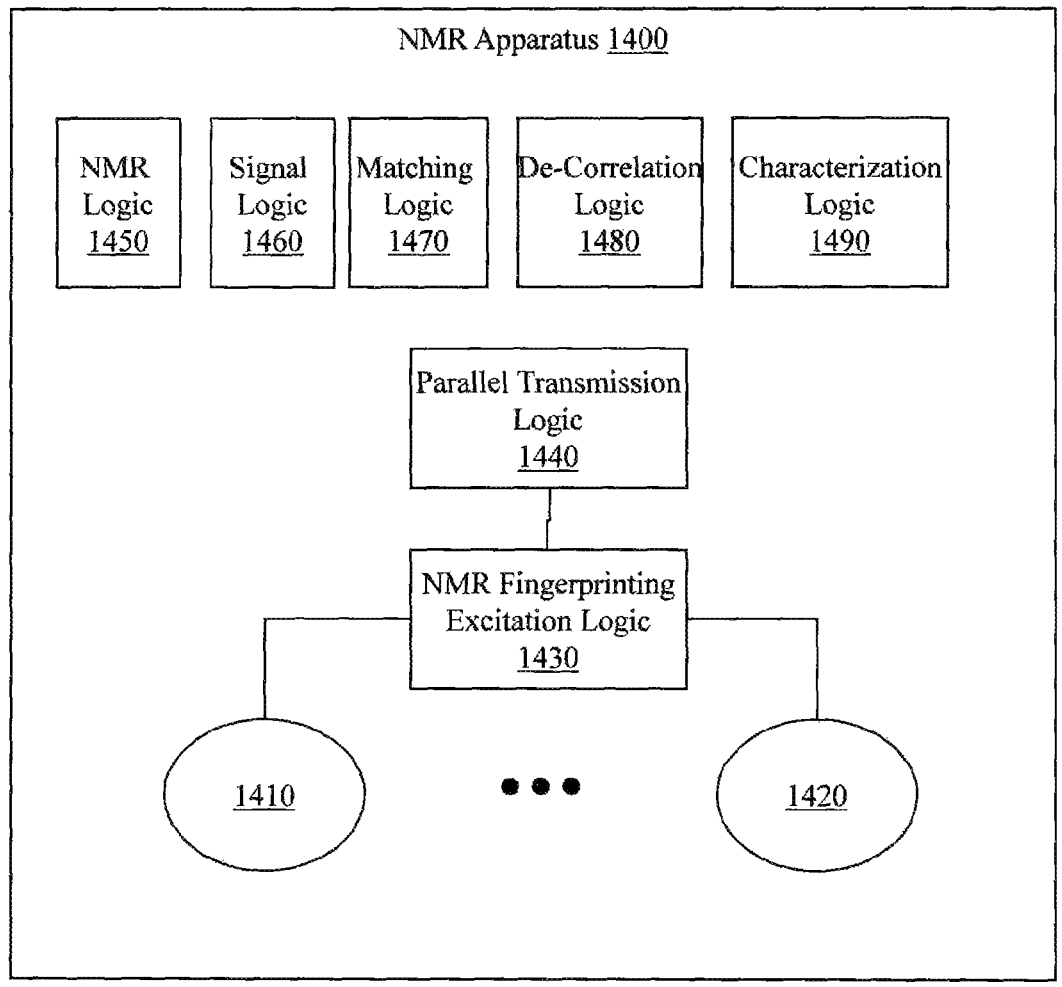
FIG. 14 illustrates an example apparatus associated with NMR fingerprinting with parallel transmission.

FIG. 14 illustrates an apparatus 1400 associated with NMR fingerprinting with parallel transmission. Apparatus 1400 includes at least two individually controllable radio frequency (RF) transmission (TX) coils 1410 and 1420. The RF TX coils 1410 and 1420 are configured to apply an NMR fingerprinting RF excitation to a sample. In one example, the at least two individually controllable RF TX coils 1410 and 1420 are configured to apply NMR fingerprinting RF excitations in parallel.

Apparatus 1400 includes an NMR fingerprinting RF excitation logic 1430 that is configured to control the at least two RF TX coils 1410 and 1420 to produce different NMR fingerprinting RF excitations. Recall that an individual NMR fingerprinting RF excitation will to cause different resonant species to produce different signal evolutions. Rather than applying the same NMR fingerprinting RF excitations from all the available TX coils, apparatus 1400 applies different excitations from different TX coils. In one example, applying the different excitations may produce a spatial inhomogeneity in a sample.

In one example, the NMR fingerprinting RF excitation logic 1430 is configured to make the first NMR fingerprinting RF excitation and the second NMR fingerprinting RF excitation vary in one or more of, amplitude, phase, frequency, flip angle, and repetition time. In another example, the NMR fingerprinting RF excitation logic 1430 is configured to control the NMR apparatus 1400 to apply RF energy to the sample in a series of variable sequence blocks that conform to NMR fingerprinting constraints. Members of the series may vary both within a coil and between coils.

Apparatus 1400 includes a parallel transmission logic 1440 that is configured to control the NMR fingerprinting RF excitation logic 1430 to cause a first individually controllable RF TX coil to apply a first NMR fingerprinting RF excitation to the sample and to cause a second individually controllable RF TX coil to apply a second, different NMR fingerprinting RF excitation to the sample. In one example, the first and second excitations are selected, coordinated, and configured to produce a spatial inhomogeneity between a first region in the sample and a second region in the sample. The first and second excitations are selected, coordinated, and configured to make the spatial inhomogeneity be sufficient to cause a resonant species in the first region to produce a first signal evolution and to cause the resonant species in the second region to produce a second signal evolution. This facilitates de-correlating the first signal evolution from the second signal evolution. While two coils and two excitations are described, it is to be appreciated that a greater number of coils and a greater number of excitations may be employed. In one embodiment, the two excitations may be produced simultaneously.

Apparatus 1400 may also include an NMR logic 1450 configured to repetitively and variably sample a (k, t, E) space associated with the sample to acquire a set of NMR signals. Recall that members of the set of NMR signals are associated with different points in the (k, t, E) space, where t is time and E includes at least T1, T2, and one other relaxation parameter, and where one or more of, t, and E, vary non-linearly.

Apparatus 1400 may also include a signal logic 1460 configured to produce an NMR signal evolution from the set of NMR signals and a matching logic 1470 configured to compare the produced NMR signal evolution to a known NMR signal evolution.

Apparatus 1400 may also include a de-correlation logic 1480 configured to de-correlate the first signal evolution from the second signal evolution and a characterization logic 1490 configured to characterize a resonant species in the object based, at least in part, on comparing the produced NMR signal evolution to the known NMR signal evolution.

In one example, the characterization logic 1490 may be configured to provide image pixel data suitable for producing a diagnostic image. The image pixel data may be identified from correlations between the produced NMR signal evolution and the known NMR signal evolution and between the known signal evolution and the image pixel data.

In another example, the characterization logic 1490 may be configured to provide relaxation parameter data identified from correlations between the produced NMR signal evolution and the known NMR signal evolution and between the known signal evolution and the relaxation parameter data.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a non-transitory medium that stores signals, instructions and/or data. A computer-readable medium may take forms, including, but not limited to, non-volatile media, and volatile media. Non-volatile media may include, for example, optical disks, magnetic disks, and other disks. Volatile media may include, for example, semiconductor memories, dynamic memory, and other memories. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and other devices. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Signal", as used herein, includes but is not limited to, electrical signals, optical signals, analog signals, digital signals, data, computer instructions, processor instructions, messages, a bit, a bit stream, or other means that can be received, transmitted and/or detected.

"User", as used herein, includes but is not limited to one or more persons, software, computers or other devices, or combinations of these.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A nuclear magnetic resonance fingerprinting method, comprising:

controlling a nuclear magnetic resonance (NMR) apparatus configured with two or more individually controllable transmit (TX) coils in order to apply to a sample, a first NMR fingerprinting radio frequency (RF) excitation from a first of the two or more TX coils and in order to apply to the sample a second, different NMR fingerprinting RF excitation from a second of the two or more TX coils; and controlling the NMR apparatus in order to simultaneously acquire the individual NMR signal evolutions simultaneously produced in response to applying the first NMR fingerprinting RF excitation and the second NMR fingerprinting RF excitation to the sample, controlling the NMR apparatus in order to compare the acquired individual NMR signals to one or more known signal evolutions, controlling the NMR apparatus in order to characterize at least one of the resonant species as a function of comparing the acquired individual NMR signals to the one or more known signal evolutions, where characterizing a resonant species comprises simultaneously identifying three parameters selected from, T1 relaxation associated with the resonant species, T2 relaxation associated with the resonant species, off-resonance relaxation associated with the resonant species, and diffusion weighted relaxation associated with the resonant species, producing parameter maps or images based on the three parameters selected from, of the T1 relaxation associated with the resonant species, the T2 relaxation associated with the resonant species, the off-resonance relaxation associated with the resonant species, and the diffusion weighted relaxation associated with the resonant species, and providing the parameter maps or the images.

2. The method of claim 1, comprising controlling the NMR apparatus in order to cause the first NMR fingerprinting RF excitation and the second NMR fingerprinting RF excitation to differ in one or more of, amplitude, phase, frequency, repetition time (TR), and flip angle.

3. The method of claim 2, comprising controlling the NMR apparatus in order to cause the first NMR fingerprinting RF excitation and the second NMR fingerprinting RF excitation to differ in an amount effective to change contrast in the sample from TR to TR, and from location to location.

4. The method of claim 1, comprising controlling the NMR apparatus in order to cause the first NMR fingerprinting RF excitation and the second NMR fingerprinting RF excitation to be applied simultaneously.

5. The method of claim 1, where the first NMR fingerprinting RF excitation and the second NMR fingerprinting RF excitation are configured to produce a spatial inhomogeneity in the sample to which the first NMR fingerprinting RF excitation and the second NMR fingerprinting RF excitation are applied, the spatial inhomogeneity produced in the sample being either a flip angle or an excitation phase distribution.

6. The method of claim 1, where the first NMR fingerprinting RF excitation and the second NMR fingerprinting RF excitation are configured to produce a spatial inhomogeneity in the sample to which the first NMR fingerprinting RF excitation and the second NMR fingerprinting RF excitation are applied, where the spatial inhomogeneity produced in the sample facilitates de-correlating signal evolutions from different signal generating regions in the sample.

7. The method of claim 1, where controlling the NMR apparatus in order to apply an NMR fingerprinting RF excitation comprises:
controlling the NMR apparatus in order to apply RF energy to the sample in a series of variable sequence blocks,
where a sequence block includes one or more excitation phases, one or more readout phases, and one or more waiting phases,
where the sample contains one or more resonant species,
where the RF energy applied during a sequence block is configured to cause the one or more resonant species to simultaneously produce individual NMR signals, and
where at least one member of the series of variable sequence blocks differs from at least one other member of the series of variable sequence blocks in at least N sequence block parameters, with N being an integer greater than one.

8. The method of claim 7, where the sequence block parameters are selected from the group including:
echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and an amount of gradient spoiling.

9. The method of claim 7, comprising:
controlling the NMR apparatus in order to vary one or more of, the amount of time between sequence blocks in the series of variable sequence blocks, the relative amplitude of RF pulses in sequence blocks in the series of variable sequence blocks, and the relative phase of RF pulses in sequence blocks in the series of variable sequence blocks,
where the series of variable sequence blocks may be presented simultaneously from two or more of the two or more TX coils.

10. The method of claim 7, comprising controlling the NMR apparatus in order to configure a member of the series of variable sequence blocks as one of, a TrueFISP pulse sequence, a FLASH pulse sequence, and a TSE pulse sequence.

11. The method of claim 1, where the known signal evolutions are one or more of, previously acquired signal evolutions, and simulated signal evolutions.

12. The method of claim 11, where the signal evolutions include signals outside the set of signal evolutions that are characterized by:

$$SE = A - Be^{-t/C}$$

where:
SE is a signal evolution,
A is a constant,
B is a constant,
t is time, and
C is a single relaxation parameter.

13. The method of claim 1, where the known signal evolutions include a signal selected from a set of signals described by one or more of:

$$SE = \prod_{i=1}^{N_A} \sum_{j=1}^{N_{RF}} R_i(\alpha) R_{RF_{ij}}(\alpha, \varphi) R(G) E_i(T1, T2, D)$$

where:
SE is a signal evolution,
$N_A$ is a number of sequence blocks,
$N_{RF}$ is a number of RF pulses in a sequence block,
$\alpha$ is a flip angle,
$\phi$ is a phase angle,
$R_i(\alpha)$ is a rotation due to off resonance,
$R_{RFij}(\alpha,\phi)$ is a rotation due to RF differences,
R(G) is a rotation due to a gradient,
T1 is spin-lattice relaxation,
T2 is spin-spin relaxation,
D is diffusion relaxation, and
$E_i(T1, T2, D)$ is decay due to relaxation differences; and $$SE = \prod_{i=1}^{N_A} \sum_{j=1}^{N_{RF}} R_i(\alpha) R_{RF_{ij}}(\alpha, \varphi) R(G) E_i(T1, T2, \ldots)$$

where:
SE is a signal evolution,
$N_A$ is a number of sequence blocks,
$N_{RF}$ is a number of RF pulses in a sequence block,
$\alpha$ is a flip angle,
$\phi$ is a phase angle,
$R_i(\alpha)$ is a rotation due to off resonance,
$R_{RFij}(\alpha,\phi)$ is a rotation due to RF differences,
R(G) is a rotation due to a gradient,
T1 is spin-lattice relaxation,
T2 is spin-spin relaxation, and
$E_i(T1,T2,\ldots)$ is decay due to relaxation differences.

14. The method of claim 1, comprising:
controlling the NMR apparatus in order to apply members of the series of variable sequence blocks according to a partially random acquisition plan that is configured to under-sample the sample at an under-sampling rate R, where the rate R is greater than or equal to two.

15. A nuclear magnetic resonance (NMR) fingerprinting apparatus, comprising:
two or more individually controllable radio frequency (RF) transmission (TX) coils configured to apply an NMR fingerprinting RF excitation to a sample, where the two or more individually controllable RF TX coils are configured to apply NMR fingerprinting RF excitations in parallel;
an NMR fingerprinting RF excitation logic circuit configured to control members of the two or more RF TX coils in order to produce NMR fingerprinting RF excitations, where an individual NMR fingerprinting RF excitation is configured to simultaneously cause different resonant species in the sample to produce different signal evolutions;
a parallel transmission logic circuit configured to control the NMR fingerprinting RF excitation logic circuit to simultaneously cause a first member of the two or more individually controllable RF TX coils to apply a first NMR fingerprinting RF excitation to the sample and also simultaneously to cause a second member of the two or more individually controllable RF TX coils to apply a second, different NMR fingerprinting RF excitation to the sample,
an NMR logic circuit configured to repetitively and variably sample a (k, t, E) space associated with the sample in order to acquire a set of NMR signals, where members of the set of NMR signals are associated with different points in the (k, t, E) space, where t is time and E includes at least T1, T2, and one other relaxation parameter, T1 being spin-lattice relaxation, and T2 being spin-spin relaxation, and where one or more of, t, and E, vary non-linearly;
a signal logic circuit configured to produce an NMR signal evolution from the set of NMR signals,
a matching logic circuit configured to compare the produced NMR signal evolution to a known NMR signal evolution, and
a characterization logic circuit configured to:
   a) characterize a resonant species in the object based, at least in part, on comparing the produced NMR signal evolution to the known NMR signal evolution,
   b) provide image pixel data suitable for producing a diagnostic image, where the image pixel data is identified from correlations between the produced NMR signal evolution and the known NMR signal evolution, as well as correlations identified from between the known signal evolution and the image pixel data, and
   c) provide relaxation parameter data identified from correlations between the produced NMR signal evolution and the known NMR signal evolution, as well as from the identified correlations between the known signal evolution and the relaxation parameter data,
where the first NMR fingerprinting RF excitation and the second NMR fingerprinting RF excitation are simultaneous and configured to produce a spatial inhomogeneity between a first region in the sample and a second region in the sample,
where the spatial inhomogeneity that is produced between the first region in the sample and the second region in the sample is sufficient enough to cause a resonant species in the first region to produce a first signal evolution and is also sufficient enough to cause the resonant species in the second region to produce a second signal evolution,
where the first signal evolution is orthogonal to the second signal evolution by more than a threshold amount, and
where the characterization logic circuit also provides: the image pixel data suitable for producing a diagnostic image, and/or the relaxation parameter data identified from the correlations, into an image computer which produces diagnostic images, and/or a display of the nuclear magnetic resonance fingerprinting apparatus.

16. The NMR apparatus of claim 15, where the NMR fingerprinting RF excitation logic circuit is configured to make the first NMR fingerprinting RF excitation and the second NMR fingerprinting RF excitation vary in one or more of, amplitude, phase, frequency, flip angle, and repetition time.

17. The NMR apparatus of claim 15, where the NMR fingerprinting RF excitation logic circuit is configured to control the NMR apparatus in order to apply RF energy to the sample in a series of variable sequence blocks,
where a sequence block includes one or more excitation phases, one or more readout phases, and one or more waiting phases,
where the sample contains one or more resonant species,
where the RF energy applied during a sequence block is configured to cause the one or more resonant species to simultaneously produce individual NMR signals, and
where at least one member of the series of variable sequence blocks differs from at least one other member of the series of variable sequence blocks in at least N sequence block parameters, with N being an integer greater than one.

18. The NMR apparatus of claim 17, where the sequence block parameters are selected from the group including:
echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling.

19. The NMR apparatus of claim 16, comprising a de-correlation logic circuit configured to de-correlate the first signal evolution from the second signal evolution.

20. The NMR apparatus of claim 15, the spatial inhomogeneity that is produced between the first region in the sample and the second region in the sample represents a flip angle distribution within the sample.

* * * * *